(12) United States Patent
Shirasaki

(10) Patent No.: US 7,901,841 B2
(45) Date of Patent: Mar. 8, 2011

(54) PELLICLE FOR PHOTOLITHOGRAPHY

(75) Inventor: Toru Shirasaki, Gunma-ken (JP)

(73) Assignee: Shin-Etsu Chemical Co., Ltd, Tokyo (JP)

( * ) Notice: Subject to any disclaimer, the term of this patent is extended or adjusted under 35 U.S.C. 154(b) by 578 days.

(21) Appl. No.: 11/898,142

(22) Filed: Sep. 10, 2007

(65) Prior Publication Data

US 2008/0063952 A1 Mar. 13, 2008

(30) Foreign Application Priority Data

Sep. 11, 2006 (JP) ................................. 2006-245823

(51) Int. Cl.
*G03F 1/00* (2006.01)

(52) U.S. Cl. .......................................................... 430/5

(58) Field of Classification Search ......... 430/5; 428/14
See application file for complete search history.

(56) References Cited

U.S. PATENT DOCUMENTS 5,470,621 A * 11/1995 Kashida et al. ................. 428/14
2006/0110664 A1* 5/2006 Hamada ............................ 430/5

OTHER PUBLICATIONS

Fujita M et al., "Pellicle-Induced Distortions in Advanced Photomasks" Proceedings of The SPIE—The International Society for Optical Engineering Eng. USA, Jul. 2007, vol. 4754, pp. 589-596.
Cotte et al., Effects of Soft Pellicle Frame Curvature and Mounting Process on Pellicle Induced Distortions in Advanced Photomasks: Proceedings of the SPIE, SPIE Bellingham, VA U.S. vol. 5040 No. 1, Mar. 2003, pp. 1044-1054.
Wistrom R et al., "Influence of the Pellicle on Final Photomask Flatness" Proceedings of The SPIE—The International Society for Optical Engineering Eng. USA, vol. 6283, No. 1, May 2006, pp. 628326-1.

* cited by examiner

*Primary Examiner* — Stephen Rosasco
(74) *Attorney, Agent, or Firm* — Lowe Hauptman Ham & Berner, LLP

(57) ABSTRACT

In a photolithographic pellicle for dustproof protection of a photomask for photolithographic patterning by mounting thereon with the aid of a pressure-sensitive adhesive layer on one end surface of the pellicle frame, the adverse influence on the flatness of the photomask caused by mounting the pellicle can be minimized when the thickness of the pressure-sensitive adhesive layer is 0.4 mm or larger or when the elastic modulus of the layer does not exceed 0.5 MPa.

2 Claims, No Drawings

PELLICLE FOR PHOTOLITHOGRAPHY

BACKGROUND OF THE INVENTION

1. Field of the Invention

The present invention relates to a pellicle for photolithography, and particularly relates to a pellicle for photolithography used as dust-proof protection in manufacturing of semiconductor devices such as LSIs and ULSIs, or liquid crystal display panels. More particularly the present invention relates to a pellicle for photolithography used in ultraviolet exposure of 200 nm or shorter, which is employed in exposures required to have high resolution.

2. Description of the Related Art

Conventionally, manufacturing of semiconductor devices such as LSIs and ULSIs, or liquid crystal display panels, and such, involves patterning a semiconductor wafer or liquid crystal plate by irradiating light thereon. However, this is problematic in that if any dust adheres to the photomask used in such cases, this dust absorbs or reflects light, altering, and roughening the edges of the transferred pattern, thereby compromising the dimensions, quality, appearance, and reducing the performance and manufacturing yield of the semiconductor devices, the liquid crystal display panels, or such.

For this reason, these operations are usually carried out in a clean room. However, since even in a clean room it is difficult to always keep an photomask clean, in order to protect the photomask from dust, a pellicle which is substantially transparent to the exposure light and which protects from dust, is attached to the surface of the photomask.

This is advantageous, as dust does not adhere directly onto the surface of the exposure plate, but onto the pellicle membrane, and therefore, dust on the pellicle membrane will not effect pattern transfer provided that focus is fixed on the pattern of the photomask at the time of photolithography.

This kind of pellicle is formed from, a transparent pellicle film formed from a significantly transmissive nitrocellulose, cellulose acetate or such, which is bonded onto the upper surface of a pellicle frame formed from aluminum, stainless steel, polyethylene or such by means of a good solvent of the pellicle film which is coated on the upper surface of the pellicle frame and air dried (for example, see Japanese Patent Application Laid-open (kokai) No. 58-219023); or alternatively by means of an adhesive, such as epoxy resin (for example, see U.S. Pat. No. 4,861,402 specification or Japanese Patent publication (kokoku) No. 63-27707), acrylic resin or fluoropolymer adhesive (for example, see Japanese Patent Application Laid-open (kokai) No. H7-168345). Furthermore, a pressure-sensitive adhesive layer formed from polybutene resin, polyvinyl acetate resin, acrylic resin, silicone resin or such, and a release layer (separator) for protecting the pressure-sensitive adhesive layer, are both bonded to the underside of the pellicle frame.

In Recent years, resolution required in photolithography is increasing. In order to realize these increased resolution, light having shorter wavelength is gradually being used as the light sources. More specifically, there is a shift towards ultraviolet light [g-line (436 nm), i-line (365 nm), KrF excimer laser (248 nm)], and recently ArF excimer laser (193 nm) are beginning to be used.

In a semiconductor exposure system, a pattern formed on a photomask is transferred onto a silicon wafer by light having a short wavelength. However, if the surfaces of the photomask (hereinafter briefly referred to as "mask") and the wafer have irregularities, the irradiating light becomes unfocused at the time of exposure, causing problems to arise in the pattern to be transferred. As the refinement of semiconductors proceeds forward, the flatness demanded for the mask and silicon wafer is gradually becoming more and more exacting. For this reason, the flatness demanded for the pattern surface in masks is also gradually becoming more exacting with demands from 2 μm, to 0.5 μm and 0.25 μm for nodes of smaller than 65 nm.

A pellicle is attached to the mask to protect the pattern from dust after the mask is completed, however, when the pellicle is attached to the mask, the flatness of the mask is altered. This phenomenon is considered to be caused by effects of the pellicle frame irregularity, on the flatness of the mask.

The pellicle is attached to the mask by means of the pressure-sensitive adhesive on one side of the pellicle frame. However, when the pellicle is attached to the mask, conventionally a force of about 20 to 30 kg is used to press and attach the pellicle to the mask. Generally, the flatness of the mask in TIR values is several μm or less, with the latest masks having flatness of 1 μm or less, however, the flatness of the pellicle frame in TIR values is generally large when compared with the mask and of several dozen μm. As a result, when the pellicle is attached to the mask, the flatness of the mask is altered due to the irregularity of the pellicle frame. Thus, it is conceivable that if the flatness of the pellicle frame is raised to the level of flatness of the mask it would be possible to reduce the change in the flatness of the mask.

The pellicle frame is usually made from an aluminum alloy. A pellicle frame for semiconductor photolithography is about 150 mm in width and about 110 to 130 mm in length with the middle portion removed. Generally, the pellicle frame is made by cutting the pellicle frame shape from a plate of aluminum alloy or, extrusion molding aluminum material in a frame shape. However, making a flat frame is not easy as the width of the frame is thin and about 2 mm and thus easily deformed. Hence, achieving flatness of the pellicle frame at the level of flatness of the mask, is extremely difficult.

In view of the above circumstances, the object of the present invention is to realize a smoothness in a mask surface to which a pellicle is attached, wherein the smoothness is not dependent on the smoothness of one end surface of a pellicle frame.

SUMMARY OF THE INVENTION

A pellicle for photolithography comprising a frame, a film bonded on one end face of said frame, and a layer of pressure-sensitive adhesive coated on an opposite end face of said frame, wherein the pressure-sensitive adhesive layer has a thickness of at least 0.4 mm.

Furthermore, the pressure-sensitive adhesive layer has an elastic modulus not exceeding 0.5 Mpa at 23° C.

According to the present invention, the flatness of a mask surface may be sufficiently maintained by means of setting the thickness and the elastic modulus of the pressure-sensitive adhesive for attaching the pellicle to the mask at a desired value, whereby the coating layer of the pressure-sensitive adhesive absorbs the irregularity of one end surface of the pellicle frame.

Conventional pellicle frames are coated on one side with a pressure-sensitive adhesive, such that by pressing the pressure-sensitive adhesive side of the pellicle frame to the mask the pellicle is mounted (bonded) on the mask. The elastic modulus of the coating layer of the pressure-sensitive adhesive is usually about 1 MPa, and generally the elastic modulus of the aluminum alloy used in the pellicle frame is about 75 GPa. Therefore, compared to the frame, the coating layer of the pressure-sensitive adhesive is extremely soft. Accordingly, it is believed that the coating layer of the pressure-sensitive adhesive would be able to absorb the irregularity of the pellicle frame, thus alleviating the effects thereof on the mask.

However, it is understood that the conventional thickness of the coating layer of the pressure-sensitive adhesive of a pellicle, which is about 0.3 mm, is insufficient for absorption of the irregularity of the pellicle frame. Consequently, it was found that by increasing the thickness of the coating layer of the pressure-sensitive adhesive, it is possible for the pressure-sensitive adhesive to absorb the irregularity of a pellicle frame, even a pellicle frame with substantial irregularity, and thus reduce the effects thereof on the flatness of the mask. The effects of the irregularity of the pellicle frame on the flatness of the mask can be effectively alleviated particularly when the thickness of the coating layer of the pressure-sensitive adhesive is at least 0.4 mm.

The elastic modulus of the coating layer of the pressure-sensitive adhesive is usually about 1 MPa, however, if a pressure-sensitive adhesive with a small elastic modulus, in other words a soft pressure-sensitive adhesive, is used, the irregularity of the pellicle frame may be effectively absorbed. The effects of the irregularity of the pellicle frame on the flatness of the mask, may be effectively alleviated by using a pressure-sensitive adhesive particularly with an elastic modulus not exceeding 0.5 MPa.

The effects of the thickness and elastic modulus (softness) of the coating layer of the pressure-sensitive adhesive on the absorption/reduction of the effects of the irregularity of the pellicle frame described above may be obtained, by setting the thickness and elastic modulus of the coating layer of the pressure-sensitive adhesive in the range of the values indicated above. However, it is particularly preferable to set the thickness of the coating layer of the pressure-sensitive adhesive at 0.4 mm or greater, and the elastic modulus at 0.5 MPa or lower. It is in this range of values that the coating layer of the pressure-sensitive adhesive particularly exhibits the effect of absorption/reduction of the effects of the irregularity of the pellicle frame.

DESCRIPTION OF THE PREFERRED EMBODIMENTS

The below are examples of the present invention.

EXAMPLE 1

After an aluminum alloy pellicle frame (outer dimensions 149 mm×113 mm×4.5 mm, 2 mm thick, with a coating layer of a pressure-sensitive adhesive having flatness of 30 µm) was washed with pure water, the thickness of a silicone-based pressure-sensitive adhesive (product name: X-40-3122A) manufactured by Shin-Etsu Chemical Co., Ltd. was changed, and applied onto one end surface of the pellicle frame, and a CYTOP adhesive (product name: CTX-A) manufactured by Asahi Glass Co., Ltd. was applied to the opposite side thereof. Afterwards, the pellicle frame was heated at 130° C. to cure the pressure-sensitive adhesive and the adhesive. After curing the pressure-sensitive adhesive had an elastic modulus of 1 MPa, and thicknesses of 0.45 mm, and 0.7 mm.

Afterwards, a pellicle membrane taken on an aluminum frame larger than the above described pellicle frame, was attached to the adhesive side of the above pellicle frame. Portions of the pellicle protruding outside the pellicle frame were removed by trimming, and the pellicle was completed.

This pellicle was attached to a mask with a flatness of 0.25 µm. When the pellicle had the 0.45 mm thick pressure-sensitive adhesive, the flatness of the mask changed to 0.36 µm, and when the pellicle had the 0.7 mm thick pressure-sensitive adhesive, the flatness of the mask changed to 0.31 µm. In both cases satisfactory results were obtained, as the amount of change in flatness of the mask after the pellicle was attached was kept to 0.25 µm or below, which was the flatness of the mask before pellicles were attached.

EXAMPLE 2

After an aluminum alloy pellicle frame (outer dimensions 149 mm×113 mm×4.5 mm, 2 mm thick, with a coating layer of a pressure-sensitive adhesive having flatness of 30 µm) was washed with pure water, the thickness of a silicone-based pressure-sensitive adhesive (product name: X-40-3264A) manufactured by Shin-Etsu Chemical Co., Ltd. was changed, and applied onto one end surface of the pellicle frame, and a CYTOP adhesive (product name: CTX-A) manufactured by Asahi Glass Co., Ltd. was applied to the opposite side thereof. Afterwards, the pellicle frame was heated at 130° C. to cure the pressure-sensitive adhesive and the adhesive. After curing the pressure-sensitive adhesive had an elastic modulus of 0.4 MPa, and thicknesses of 0.3 mm, 0.45 mm, and 0.7 mm.

Afterwards, a pellicle film made with an aluminum frame larger than the above described pellicle frame, was attached to the adhesive side of the above pellicle frame. Portions of the pellicle protruding outside the pellicle frame were removed, and the pellicle was completed.

This pellicle was attached to a mask with a flatness of 0.25 µm. When the pellicle had the 0.3 mm thick layer of the pressure-sensitive adhesive, the flatness of the mask changed to 0.38 µm, when the pellicle had the 0.45 mm thick pressure-sensitive adhesive, the flatness of the mask changed to 0.29 µm, and when the pellicle had the 0.7 mm thick pressure-sensitive adhesive, the flatness of the mask changed to 0.27 µm. As the elastic modulus of the coating layer of the pressure-sensitive adhesive was 0.4 MPa even when the coating layer of the pressure-sensitive adhesive had a thickness of 0.3 mm, the amount of change in the flatness of the mask after the pellicle was attached was kept to 0.25 µm or below, which was the flatness of the mask before pellicles were attached; and as such satisfactory results were obtained in the present example. Moreover, excellent results were obtained when the coating layer of the pressure-sensitive adhesive had thicknesses of 0.45 mm and 0.7 mm, as the amount of change in flatness of the mask was no greater than 0.05 µm.

EXAMPLE 3

After an aluminum alloy pellicle frame (outer dimensions 149 mm×113 mm×4.5 mm, 2 mm thick, with a coating layer of a pressure-sensitive adhesive having flatness of 30 µm) was washed with pure water, the thickness of a silicone-based pressure-sensitive adhesive (product name: X-40-3264B) manufactured by Shin-Etsu Chemical Co., Ltd. was changed, and applied onto one end surface of the pellicle frame, and a CYTOP adhesive (product name: CTX-A) manufactured by Asahi Glass Co., Ltd. was applied to the opposite side thereof. Afterwards, the pellicle frame was heated at 130° C. to cure the pressure-sensitive adhesive and the adhesive. After curing the pressure-sensitive adhesive had an elastic modulus of 0.1 MPa, and thicknesses of 0.3 mm, 0.45 mm, and 0.7 mm.

Afterwards, a pellicle film made with an aluminum frame larger than the above described pellicle frame, was attached to the adhesive side of the above pellicle frame. Portions of the pellicle protruding outside the pellicle frame were removed, and the pellicle was completed.

This pellicle was attached to a mask with a flatness of 0.25 µm. When the pellicle had the 0.3 mm thick layer of a pressure-sensitive adhesive, the flatness of the mask changed to 0.33 µm, when the pellicle had the 0.45 mm thick layer of a pressure-sensitive adhesive, the flatness of the mask changed to 0.27 µm, and when the pellicle had the 0.7 mm thick layer of a pressure-sensitive adhesive, the flatness of the mask remained at 0.25 µm. As the elastic modulus of the coating layer of the pressure-sensitive adhesive was 0.1 MPa even when the coating layer of the pressure-sensitive adhesive had a thickness of 0.3 mm, the amount of change in the flatness of the mask after the pellicle was attached was kept to 0.25 µm or below, which was the flatness of the mask before pellicles were attached; and as such satisfactory results were obtained in the present example. Moreover, excellent results were obtained when the coating layer of the pressure-sensitive adhesive had thicknesses of 0.45 mm and 0.7 mm, as the amount of change in flatness of the mask was no greater than 0.05 µm. An especially excellent result was obtained when the pellicle had the 0.7 mm thick coating layer of the pressure-sensitive adhesive, as there was no change to the flatness of the mask.

COMPARATIVE EXAMPLE 1

After an aluminum alloy pellicle frame (outer dimensions 149 mm×113 mm×4.5 mm, 2 mm thick, with a coating layer of a pressure-sensitive adhesive having flatness of 30 µm) was washed with pure water, the thickness of a silicone based pressure-sensitive adhesive (product name: X-40-3122A) manufactured by Shin-Etsu Chemical Co., Ltd. was changed, and applied onto one end surface of the pellicle frame, and a CYTOP adhesive (product name: CTX-A) manufactured by Asahi Glass Co., Ltd. was applied to the opposite side thereof. Afterwards, the pellicle frame was heated at 130° C. to cure the pressure-sensitive adhesive and the adhesive. After curing the pressure-sensitive adhesive had an elastic modulus of 1 MPa, and a thickness of 0.3 mm.

Afterwards, a pellicle film made with an aluminum frame larger than the above described pellicle frame, was attached to the adhesive side of the above pellicle frame. Portions of the pellicle protruding outside the pellicle frame were removed, and the pellicle was completed.

When this pellicle was attached to a mask with flatness of 0.25 µm, the flatness of the mask deteriorated to 0.6 µm. The change of flatness of the mask unfortunately surpassed 0.25 µm which was the flatness of the mask before the pellicle was attached.

Note the measured amounts of change of the flatness of the mask before and after the pellicles were attached in the above described examples and comparative example are shown in Table 1.

TABLE 1

| | | Changes in flatness of photomask by attachment of pellicle Elastic modulus of pressure-sensitive adhesive | | |
|---|---|---|---|---|
| | | 1 MPa | 0.4 MPa | 0.1 MPa |
| Thickness of pressure-sensitive adhesive layer | 0.3 mm | 0.30 µm | 0.13 µm | 0.08 µm |
| | 0.45 mm | 0.11 µm | 0.04 µm | 0.02 µm |
| | 0.7 mm | 0.06 µm | 0.02 µm | 0.00 µm |

According to the present invention, the flatness of the photolithography mask can sufficiently be maintained easily, thereby enabling the photolithographic mask to handle exposure to ultraviolet light of short wavelengths. Therefore the present invention makes a significant contribution to industries using photolithography.

What is claimed is:

1. A pellicle for photolithography comprising a frame, a film bonded on one end face of said frame, and a layer of pressure-sensitive adhesive coated on an opposite end face of said frame, wherein the pressure-sensitive adhesive layer has an elastic modulus not exceeding 0.5 Mpa at 23° C.

2. A pellicle for photolithography as claimed in claim 1, wherein the pressure-sensitive adhesive layer has a thickness of at least 0.4 mm.

* * * * *